United States Patent
Dai et al.

(10) Patent No.: US 10,636,963 B2
(45) Date of Patent: Apr. 28, 2020

(54) MAGNETIC TUNNEL JUNCTIONS

(71) Applicant: Taiwan Semiconductor Manufacturing Co., Ltd., Hsinchu (TW)

(72) Inventors: Pin-Ren Dai, Taipei (TW); Chung-Ju Lee, Hsinchu (TW); Chung-Te Lin, Tainan (TW); Chih-Wei Lu, Hsinchu (TW); Hsi-Wen Tien, Hsinchu (TW); Tai-Yen Peng, Hsinchu (TW); Chien-Min Lee, Hsinchu (TW); Wei-Hao Liao, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/122,179

(22) Filed: Sep. 5, 2018

(65) Prior Publication Data
US 2019/0148633 A1    May 16, 2019

Related U.S. Application Data

(60) Provisional application No. 62/586,282, filed on Nov. 15, 2017.

(51) Int. Cl.
| | | |
|---|---|---|
| *H01L 29/82* | (2006.01) | |
| *H01L 43/12* | (2006.01) | |
| *H01L 27/22* | (2006.01) | |
| *H01L 43/02* | (2006.01) | |
| *H01L 43/08* | (2006.01) | |
| *H01L 43/10* | (2006.01) | |

(52) U.S. Cl.
CPC .......... *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC .......... G11C 2211/5615; G11C 11/161; H01L 43/12; H01L 27/222
See application file for complete search history.

(56) References Cited

U.S. PATENT DOCUMENTS

| | | | |
|---|---|---|---|
| 9,660,186 B2 * | 5/2017 | Bae ..................... | H01L 22/12 |
| 2018/0182809 A1 * | 6/2018 | Liu ..................... | H01L 27/222 |
| 2018/0350875 A1 * | 12/2018 | Han ..................... | H01L 23/53295 |

\* cited by examiner

*Primary Examiner* — Hsien Ming Lee
(74) *Attorney, Agent, or Firm* — Sterne, Kessler, Goldstein & Fox P.L.L.C.

(57) ABSTRACT

The present disclosure describes a method utilizing an ion beam etch process, instead of a RIE etch process, to form magnetic tunnel junction (MTJ) structures. For example, the method includes forming MTJ structure layers on an interconnect layer, where the interconnect layer includes a first area and a second area. The method further includes depositing a mask layer over the MTJ structure layers in the first area and forming masking structures over the MTJ structure layers in the second area. The method also includes etching with an ion beam etch process, the MTJ structure layers between the masking structures to form MTJ structures over vias in the second area of the interconnect layer; and removing, with the ion beam etch process, the mask layer, the top electrode, the MTJ stack, and a portion of the bottom electrode in the first area of the interconnect layer.

20 Claims, 8 Drawing Sheets

MAGNETIC TUNNEL JUNCTIONS

CROSS-REFERENCE TO RELATED APPLICATION

This application claims the benefit of U.S. Provisional Patent Application No. 62/586,282, titled "Magnetic Tunnel Junctions," which was filed on Nov. 15, 2017 and is incorporated herein by reference in its entirety.

BACKGROUND

Magnetic tunneling junctions (MTJs) are an integral part of magnetic random access memories (MRAMs). A fabrication process of an MTJ structure may involve a variety of operations, such as metal and dielectric depositions, photolithography and etch processes, etc. Some of these fabrication processes may damage the MTJ layers and compromise electrical properties of the resulting MTJ structures.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
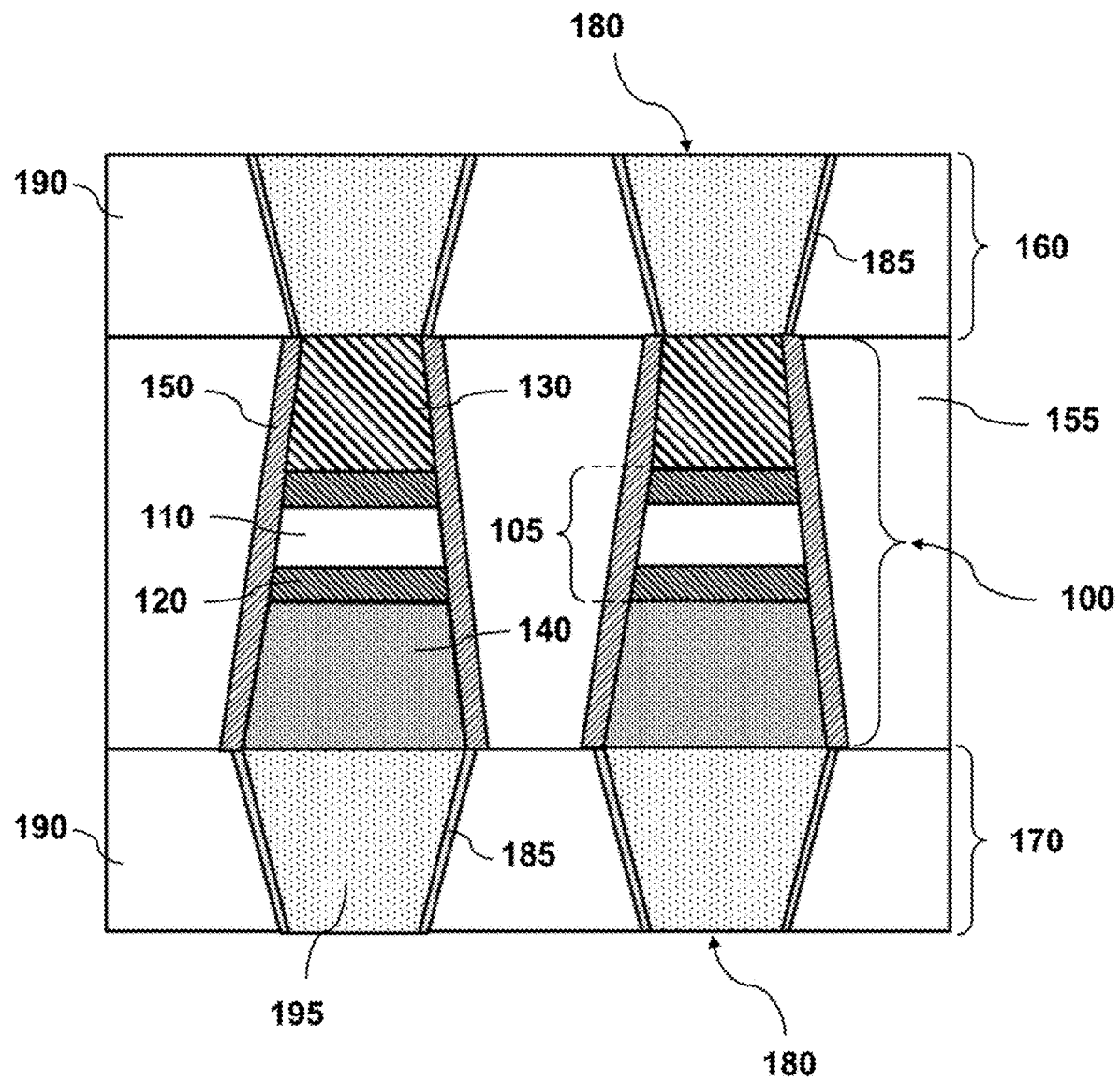
FIG. 1 is a cross-sectional view of an exemplary magnetic tunnel junction structure formed between two interconnect layers, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

Magnetic tunneling junctions (MTJs) are an integral part of magnetic random access memories (MRAMs). A fabrication process of an MTJ structure can involve a variety of operations, such as metal and dielectric depositions, photolithography and etch operations, etc. Some of these fabrication processes may damage the MTJ layers and compromise the electrical properties of the resulting MTJ structures. For example, an etch operation, which can be used to etch a bottom electrode of an MTJ structure, may include a reactive ion etch (RIE) process that employs a halogen gas as an etchant. Halogen ions generated form a RIE plasma (e.g., chlorine ions) can diffuse through a spacer material that surrounds the MTJ structure and act as ionic mobile charges in the MTJ layers. The presence of ionic mobile charges in the MTJ layers can result in unpredictable MTJ operation and is therefore undesirable.

The embodiments described herein are directed to an exemplary fabrication method that utilizes an ion beam etch process to form one or more MTJ structures. The ion beam etch uses an inert gas plasma and can reduce the ionic mobile charges in the MTJ structures. Further, a hard mask layer, introduced at the periphery of a die, can mitigate etch loading effects (e.g., etch rate differences) between high density areas of the die (e.g., MRAM regions) and low density areas of the die (e.g., the die periphery).

By way of example and not limitation, MTJ structures may be formed between two interconnect layers. For example, an MTJ structure can be formed in an interlayer dielectric (ILD) between two interconnect levels. A cross-sectional view of an exemplary MTJ structure 100 is shown in FIG. 1. MTJ structure 100 is a multilayer structure that can include MTJ layers (or MTJ stack) 105, a top electrode 130, and a bottom electrode 140. MTJ layers (or MTJ stack) 105 can be a stack of materials that include a non-conductive layer 110 disposed between two ferromagnetic layers 120. In some embodiments, non-conductive layer 110 can be made of magnesium oxide (MgO), aluminum oxide ($AlO_x$), aluminum oxynitride (AlON) or combinations thereof. According to some embodiments, non-conductive layer 110 can be deposited by a physical vapor deposition (PVD) technique. Alternatively, non-conductive layer 110 may be deposited by other deposition techniques, such as plasma-enhanced PVD (PEVD), chemical vapor deposition (CVD), plasma-enhanced CVD (PECVD), atomic layer deposition (ALD), plasma-enhanced ALD (PEALD), or any other suitable deposition technique.

In some embodiments, ferromagnetic layers 120 can be metal stacks with one or more layers that include any combination of iron (Fe), cobalt (Co), ruthenium (Ru), and magnesium (Mg). According to some embodiments, ferromagnetic layers 120 can be deposited by PVD. Alternatively, ferromagnetic layers 120 may be deposited by PEVD, CVD, PECVD, ALD, PEALD, or any other suitable deposition method. In some embodiments, the thickness of MTJ layers 105 can range from about 100 Å to about 400 Å.

Further, top electrode 130 and bottom electrode 140 are in electrical contact with ferromagnetic layers 120. According to some embodiments, top electrode 130 can made of tantalum (Ta), tantalum nitride (TaN), titanium nitride (TiN), tungsten (W), or combinations thereof. For example, top electrode 130 can be a stack made of a bottom TiN layer and a top TaN layer. Top electrode 130 can be deposited by CVD or PVD, according to some embodiments. Bottom electrode 140 can be made of TiN, TaN, Ru, copper (Cu), or combinations thereof. Bottom electrode 140 can be deposited by CVD or PVD. In some embodiments, top and bottom electrode 130 and 140 can each have a thickness between about 300 Å and about 800 Å.

A capping layer, or spacer, 150 can protect MTJ structure 100 from plasma damage during the formation process. In some embodiments, capping layer 150 can be a stack made of silicon nitride (SiN), silicon oxide ($SiO_2$), silicon carbide (SiC), a metal oxide, or combinations thereof. By way of example and not limitation, capping layer 150 can be deposited by CVD or ALD at a deposition temperature between about 180° C. and about 250° C. The thickness of capping layer 150 can range from about 50 Å to about 3000 Å.

MTJ structure 100 and capping layer, or spacer, 150 are embedded in an ILD 155. In some embodiments, ILD 155 can be a low-k dielectric material with a dielectric constant (e.g., k-value) below 3.9. In some embodiments, ILD 155 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 155 can be deposited by a high-density plasma CVD (HDPCVD) process or a PECVD process.

In some embodiments, top electrode 130 can be connected to a top interconnect layer 160, and bottom electrode 140 can be connected to a bottom interconnect layer 170. Top and bottom interconnect layers (e.g., 160 and 170 respectively) can be interconnect layers in a back end of the line (BEOL) that may include several vertical interconnect access lines (vias) 180 and lateral lines (lines) (not shown in FIG. 1). According to some embodiments, vias 180 and lines (not shown in FIG. 1) of interconnect layers 160 and 170 can be filled with a metal stack that includes a barrier layer 185 and a metal fill 195. Barrier layer 185 can be a stack of two or more layers and metal fill 195 can be an electroplated metal. For example, barrier layer 185 can be a TaN/Ta stack deposited by PVD, and metal fill 195 can be electroplated copper. In some embodiments, top and bottom interconnect layers (e.g., 160 and 170 respectively) may include more than one interconnect layer. According to some embodiments, ILD 190 can be different from ILD 155. In some embodiments, ILD 190 can be a low-k material that has dielectric constant below 3.9. In some embodiments, ILD 190 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 190 can be deposited with a high-density plasma CVD (HDP-CVD) or a PECVD process.

In some embodiments, bottom interconnect layer 170 can be formed before MTJ structures 100, and top interconnect layer 160 can be formed after MTJ structures 100. In some embodiments, additional MTJ structures 100 can be formed between interconnect layers 170 and 160. Top and bottom interconnect layers (e.g., 160 and 170 respectively)—along with the one or more MTJ structures, like MTJ structure 100—can be part of an integrated circuit (IC) structure. The IC structure may include several layers, not shown in FIG. 1. For example, additional BEOL layers, middle of the line (MOL) layers, and front end of the line (FEOL) layers can be formed below interconnect layer 170. A FEOL layer may include, for example, transistors and capacitor structures and an MOL layer can provide electrical connections between the transistors in the FEOL and the structures in the BEOL layers.

Figure 2:
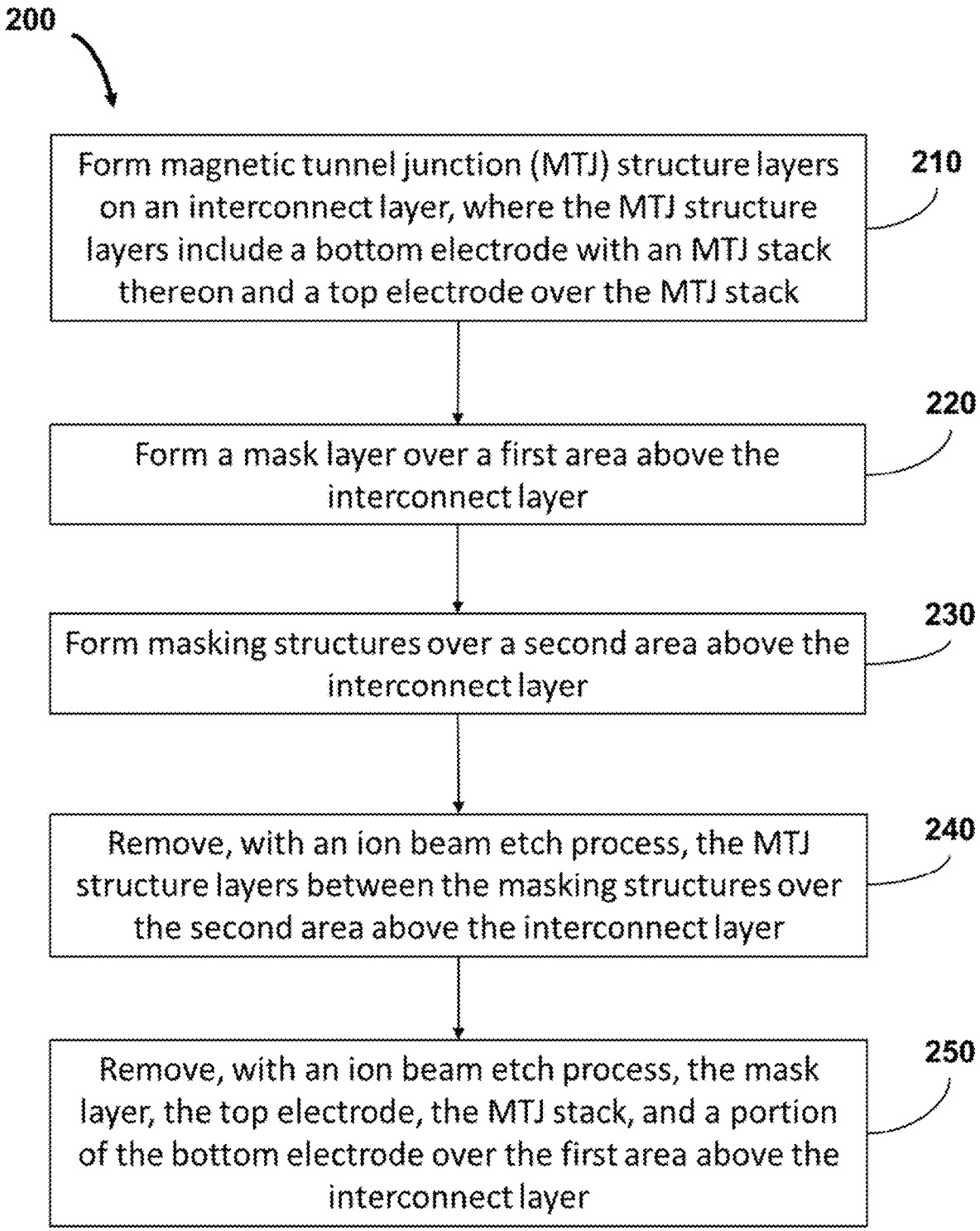
FIG. 2 is a flowchart of an exemplary fabrication method for forming a magnetic tunnel junction structure, according to some embodiments.

FIG. 2 is a flowchart of an exemplary fabrication method 200 for forming an MTJ structure, according to some embodiments. In some embodiments, fabrication method 200 utilizes (i) an ion beam etch process that has a halogen-free gas etchant; and (ii) an additional hard mask layer that is selectively formed in a periphery of a die to address loading effects (e.g., differences in etch rate) between dense and low density areas of the die as a result of the ion beam etch process. Fabrication method 200 may not be limited to the operations described below. Other fabrication operations may be performed between the various operations of fabrication method 200 and may be omitted merely for clarity.

Figure 3:
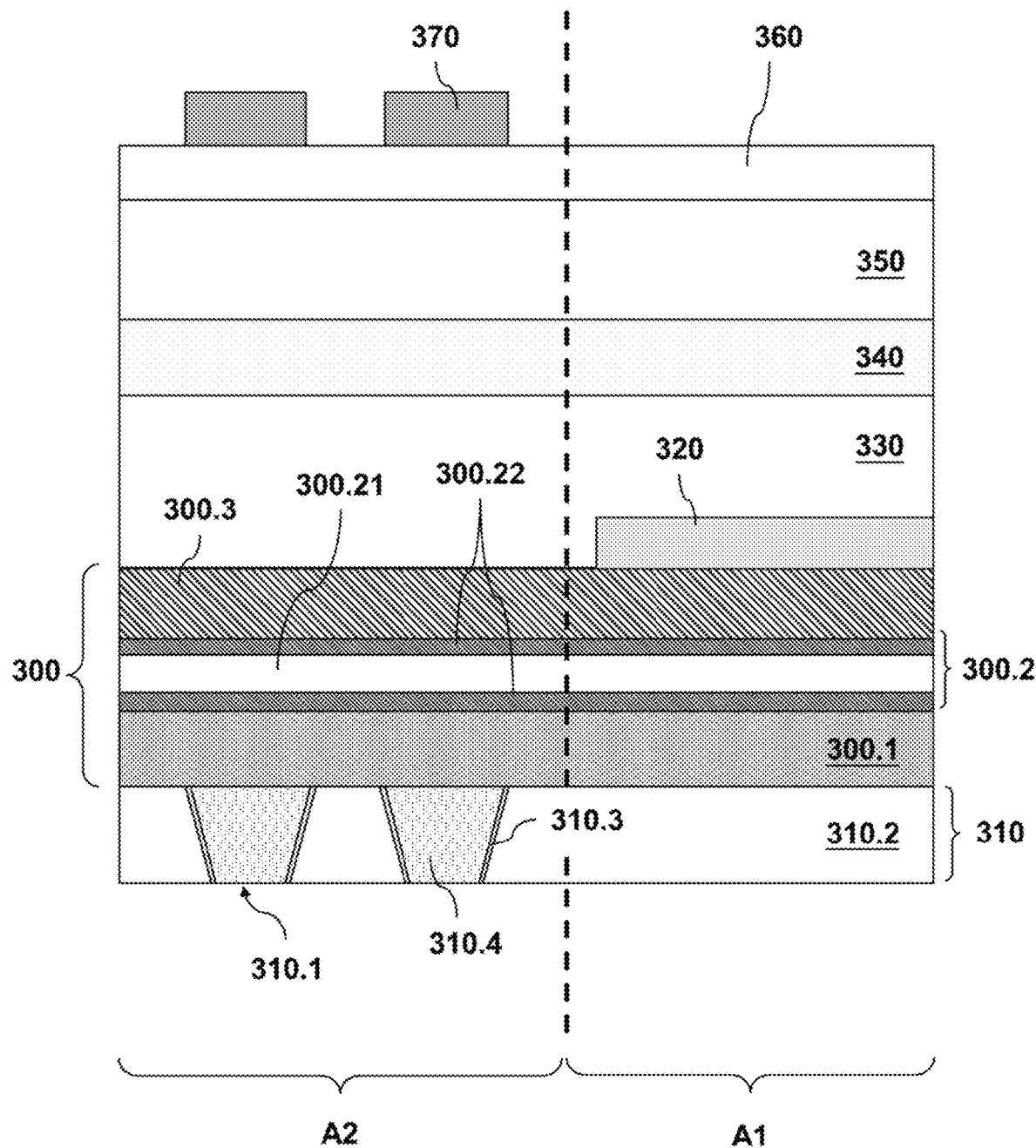
FIG. 3 is a cross-sectional view of exemplary magnetic tunnel junction structure layers over an interconnect layer after formation of hard mask and photoresist layers, according to some embodiments.

In referring to FIG. 2, exemplary fabrication method 200 begins with operation 210 and the formation of MTJ structure layers on an interconnect layer. FIG. 3 is a cross-sectional view of MTJ structure layers 300 over an interconnect layer 310. According to some embodiments, MTJ structure layers 300 can include bottom electrode 300.1, MTJ stack 300.2, and top electrode 300.3. As discussed above, MTJ stack 300.2 can be a multilayer structure that includes a non-conductive layer 300.21 disposed between two ferromagnetic layers 300.22. In some embodiments, non-conductive layer 300.21 can be MgO, $AlO_x$, AlON, or combinations thereof. According to some embodiments, non-conductive layer 300.21 can be deposited by a PVD process. Alternatively, non-conductive layer 300.21 may be deposited by PEVD, CVD, PECVD, ALD, PEALD, or any other suitable deposition method. By way of example and not limitation, ferromagnetic layers 300.22 can be metal stacks with one or more layers that include any combination of Fe, Co, Ru, and Mg. According to some embodiments, ferromagnetic layers 300.22 can be deposited by a PVD process. Alternatively, ferromagnetic layers 300.22 may be deposited by PEVD, CVD, PECVD, ALD, PEALD, or any other suitable deposition method. In some embodiments, the thickness of MTJ structure layers 300 can range from about 100 Å to about 400 Å.

Further, a top electrode 300.3 and a bottom electrode 300.1 are in contact with the respective ferromagnetic layers 300.22. According to some embodiments, top electrode 300.3 can made of Ta, TaN, TiN, W, or combinations thereof. For example, top electrode 300.3 can be a stack made of a bottom TiN layer and a top TaN layer. Top electrode 300.3 can be deposited by CVD or PVD, according to some embodiments. Bottom electrode 300.1 can be made of TiN, TaN, Ru, Cu, or combinations thereof. Similarly, bottom electrode 300.1 can be deposited by CVD or PVD. By way of example and not limitation, top and bottom electrode 300.3 and 300.1 can have a thickness between about 300 Å and about 800 Å.

In some embodiments, interconnect layer 310 can be formed prior to the formation of MTJ structure layers 300 using BEOL fabrication operations. According to some embodiments, interconnect layer 310 can be over other layers, not shown in FIG. 3. These other layers may include, for example, additional interconnect layers and/or middle of the line (MOL) layers over field effect transistors formed on a substrate (e.g., a wafer). Interconnect layer 310 can include one or more vias 310.1 and lines (not shown in FIG. 3) embedded in an ILD 310.2, according to some embodiments. Vias 310.1 can be filled with a metal stack that can include barrier layer 310.3 and a metal fill 310.4, according to some embodiments. By way of example and not limitation, barrier layer 310.3 can be a TaN/Ta stack deposited by PVD and metal fill 310.4 can be electroplated copper. In some embodiments, barrier layer 310.3 can be deposited by a PVD process. ILD 310.2 can be a low-k dielectric with a k-value below 3.9 (e.g., 3.2). In some embodiments, ILD 310.2 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. By way of example and not limitation, ILD 310.2 can be deposited by an HDPCVD process or a PECVD process.

In operation 220 of fabrication method 200 and referring to FIG. 3, a mask layer 320 can be formed on a first area A1 above interconnect layer 310. In some embodiments, first area A1 above interconnect layer 310 can be, for example, the periphery of a die where MRAM cells are not formed. According to some embodiments, the periphery of the die can be a low density area. In some embodiments, mask layer 320 can be Ta, TiN, TaN, Ru, an oxide (e.g., silicon oxide), silicon carbide (SiC) or SiN deposited by a PVD or CVD process at a thickness of about 100 Å to about 500 Å. Mask layer 320 can be formed by a blanket deposition over interconnect layer 310. Mask layer 320 can be subsequently patterned using photolithography and etch operations so that a pattern of mask layer 320 remains on the periphery of the die. In some embodiments, mask layer 320 can mitigate loading effects (e.g., difference in etch rates) for an ion beam etch process between high density areas of the die (e.g., an MRAM cell) and low density areas of the die (e.g., die periphery).

In operation 230 of fabrication method 200 and referring to FIG. 3, masking structures are formed over a second area A2 above interconnect layer 310. In some embodiments, second area A2 above interconnect layer 310 can be an MRAM cell area of a die, where MTJ structures can be formed. A hard mask layer 330 can be "blanket" deposited over mask layer 320 and top electrode 300.3. In some embodiments, a subsequent chemical mechanical planarization process can provide a nominally flat top surface (e.g., within about 100 Å or less) of hard mask layer 330 across the die. In some embodiments, the thickness of hard mask layer 330 can be between about 700 Å to about 1400 Å. At the periphery of the die, and due to the presence of mask layer 320, hard mask layer 330 can be thinner by an amount equal to the thickness of mask layer 320 (e.g., about 100 Å to 500 Å) when compared to other areas of the die, such as the MRAM cell area. For example, if mask layer 320 is 300 Å and the thickness of hard mask layer 330 is about 1000 Å at the MRAM cell area, the thickness of hard mask layer 330 at the periphery of the die can be about 700 Å.

According to some embodiments, hard mask layer 330 can be a SiN layer, a silicon oxynitride (SiON) layer, a titanium oxide layer, an amorphous carbon (a-carbon) layer, a silicon carbide layer, or an amorphous silicon (a-Si) layer. In some embodiments, hard mask layer 320 can be deposited by a PVD or CVD process.

In some embodiments, an etch stop layer (ESL) 340 can be formed over hard mask layer 330. In some embodiments, ESL 340 can be a fullerene-based spin on carbon (SoC) layer that has a different etch rate compared to hard mask layer 330. For example, an etch process may have higher selectivity towards SoC compared to hard mask layer 330. According to some embodiments, SoC ESL layer 340 can be spin coated over hard mask layer 330 at thicknesses between about 1000 Å and about 1500 Å.

Subsequently, a second hard mask layer 350 is deposited over ESL 340. Hard mask layer 350 can be similar to hard mask layer 330. For example, second hard mask layer 350 can be Ta, TiN, TaN, Ru, an oxide (e.g., silicon oxide), silicon carbide, or SiN deposited by a PVD or CVD process. Hard mask layer 350 can be thinner than hard mask layer 330. For example, the thickness of hard mask layer 350 can range from about 200 Å to about 600 Å.

Figure 4:
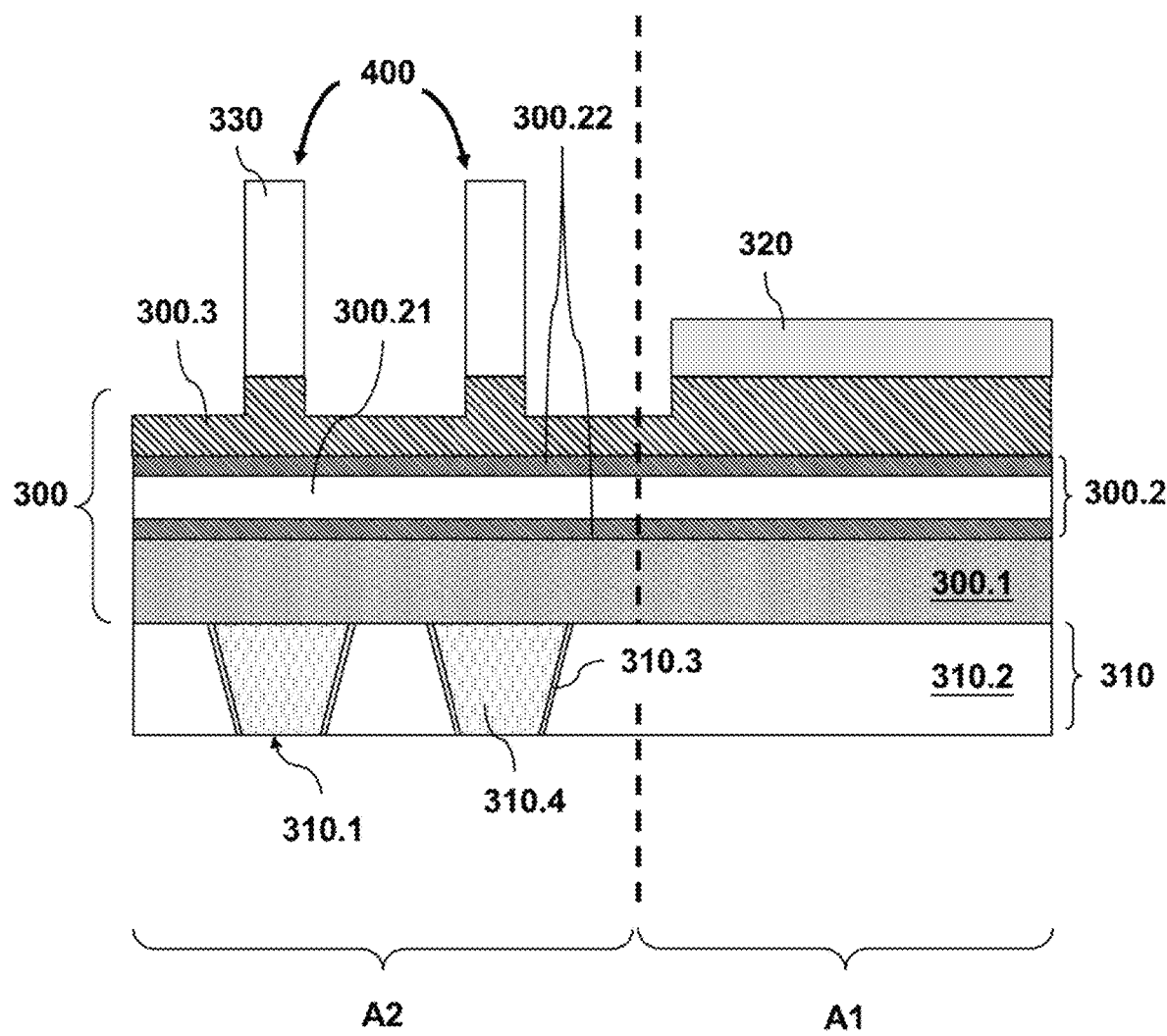
FIG. 4 is a cross-sectional view of exemplary magnetic tunnel junction structure layers over an interconnect layer after formation of masking structures, according to some embodiments.

A backside reflective coating (BARC) 360 and a photoresist layer can be deposited over hard mask layer 350. In some embodiments, the photoresist layer can be patterned to form patterned photoresist structures 370 over, for example, the MRAM cell areas of a die. In some embodiments, patterned photoresist structures 370 are vertically aligned to vias 310.1 of interconnect layer 310. In some embodiments, an etch process can etch portions of BARC 360, hard mask layer 350, ESL 340 and hard mask layer 330 that are not covered by patterned photoresist structures 370. In some embodiments, the etch process may include multiple steps and chemical etchants with different selectivity values for hard mask layers 350/330 and ESL 340. According to some embodiments, FIG. 4 shows resulting masking structures 400 after the completion of an etch process, according to some embodiments. In some embodiments, top electrode 300.3 may be recessed, or partially etched, over second area A2 (e.g., over MRAM cell areas of a die). In some embodiments, masking structures 400 act as an etch mask for a subsequent exemplary ion beam etch process.

Figure 5:
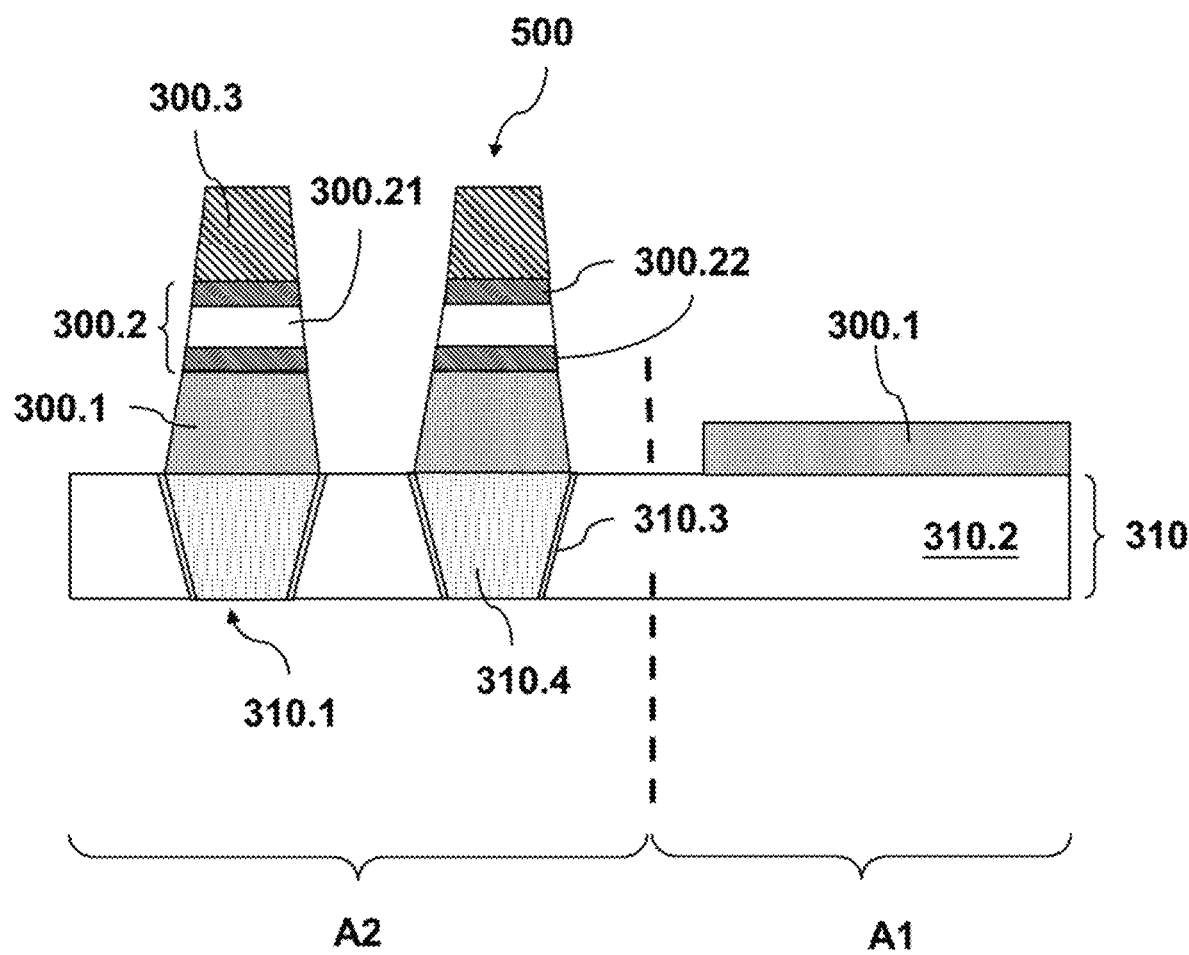
FIG. 5 is a cross-sectional view of exemplary magnetic tunnel junction structures over an interconnect layer after an ion beam etch process, according to some embodiments.

In operation 240 of fabrication method 200 and referring to FIGS. 4 and 5, an exemplary ion beam etch process removes MTJ structure layers 300 between masking structures 400 over second area A2 (e.g., over the MRAM cell area of a die) and above interconnect layer 310. According to some embodiments, the ion beam etch process removes bottom electrode 300.1 over the MRAM cell areas of a die. The exemplary ion beam etch process can employ a halogen-free gas such as He, Ne, Ar, Kr, or Xe, and prevent halogen ion contamination of MTJ stack 300.2 during the etch process. In an ion beam etching process, ions are generated in a discharge chamber, where atoms of a gas (e.g., He, Ne, Ar, Kr, or Xe) are ionized by energetic electron bombardment. Electrons are emitted from a cathode filament and collected by an anode. A magnetic field can be used to contain the electrons and increase the probability of ionization between the gas atoms and the electrons. The bombardment of gas atoms with electrons produces a plasma with positively charged gas ions. A negatively biased grid can accelerate the gas ions that pass through the grid to form the ion beam. A neutralizer filament can be used to introduce electrons to balance the positively-charged ions. The beam current and voltage can be independently controlled to obtain a desired ion energy (expressed in electron-Volts, eV) and beam current density (expressed in Amperes/cm$^2$). A vacuum of about $10^{-6}$ Torr to about $10^{-5}$ Torr is required to produce the ion beam plasma and mitigate contamination to the substrate during the etching process. The substrate can be, for example, mounted onto a rotating stage assembly. Several axis of rotation can be employed to achieve a uniform etch profile and control the angle of incidence of the ion beam (e.g., the angle of the beam measured from normal to the substrate's surface).

According to some embodiments, the ion energy during etch can range from about 100 eV to about 1200 eV, and the incident angle of the ion beam can range from 0° to about 65°. In some embodiments, the ion beam etch is anisotropic and can be performed at a temperature between about 40° C. to about 120° C.

In operation 250 of fabrication method 200 and referring to FIGS. 4 and 5, the ion beam etch process can remove mask layer 320, top electrode 300.3, MTJ stack 300.2, and a portion of bottom electrode 300.1 over first area A1 of the interconnect layer 310 (e.g., at the periphery of a die), according to some embodiments. In some embodiments, operation 250 may occur concurrently or successively with operation 240 of fabrication method 200. FIG. 5 is a cross-sectional view of the resulting MTJ structures 500 in second area A2 above interconnect layer 310 (e.g., in an MRAM cell area of the die) after operations 240 and 250 of fabrication method 200. In some embodiments, the MTJ structures in second area A2 are physically connected to vias 310.1 of interconnect layer 310. According to some embodiments, in the periphery of the die (e.g., first area A1 above interconnect layer 310), MTJ structures 500 are not formed and the partially etched bottom electrode layer 300.1 above interconnect layer 310 is thinner compared to the formed bottom electrode 300.1 of MTJ structures 500 in second area A2.

Figure 6:
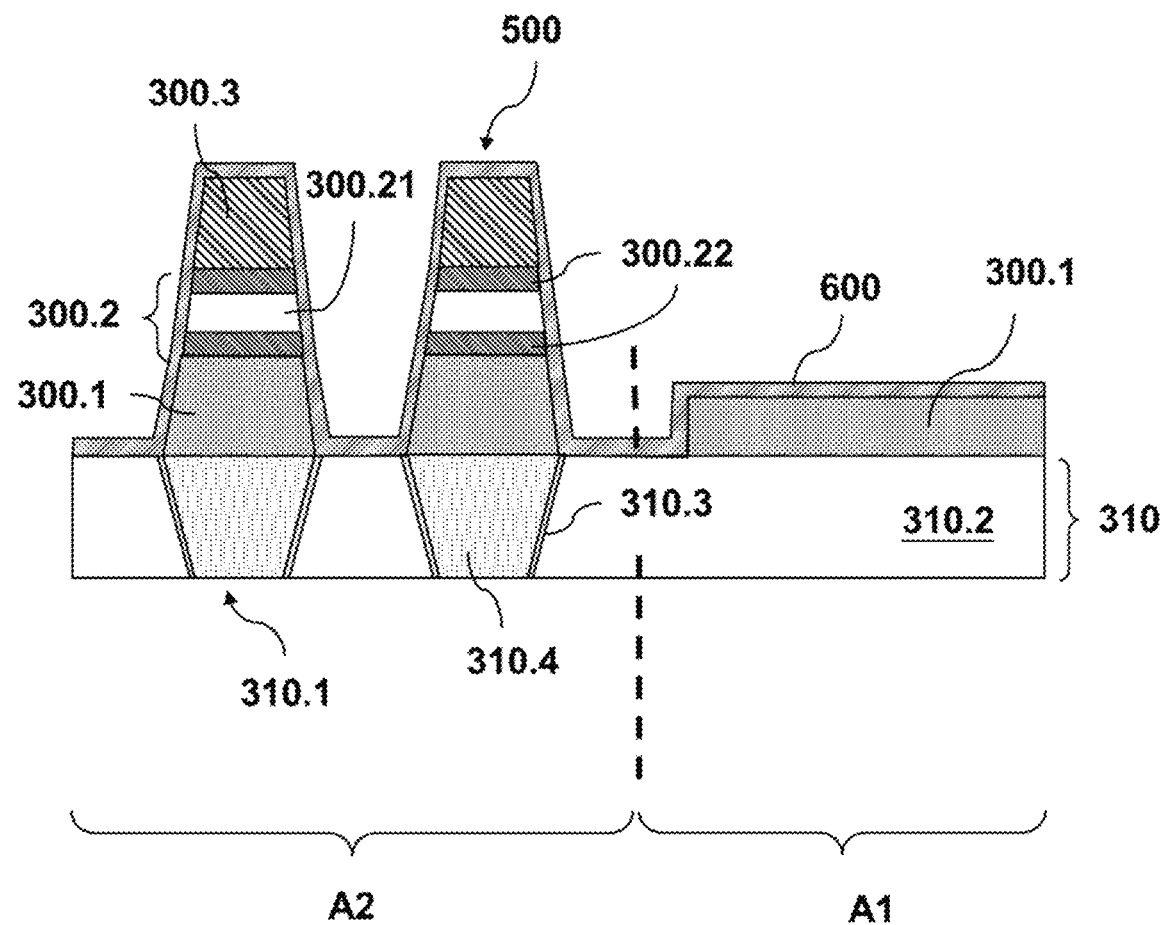
FIG. 6 is a cross-sectional view of exemplary magnetic tunnel junction structures over an interconnect layer after deposition of a capping layer, according to some embodiments.

In referring to FIG. 6, and according to some embodiments, a capping layer 600 can be "blanket" deposited over MTJ structures 500 and bottom electrode 300.1 in second and first areas above interconnect layer 310 (e.g., A2 and A1 respectively). Capping layer 600 can be a stack of SiN, silicon oxide, SiC, a metal oxide, or combinations thereof that can be deposited by a CVD or an ALD process at a temperature between about 180° C. and about 250° C. In some embodiments, capping layer 600 can have a thickness that ranges from about 50 Å to about 3000 Å.

Figure 7:
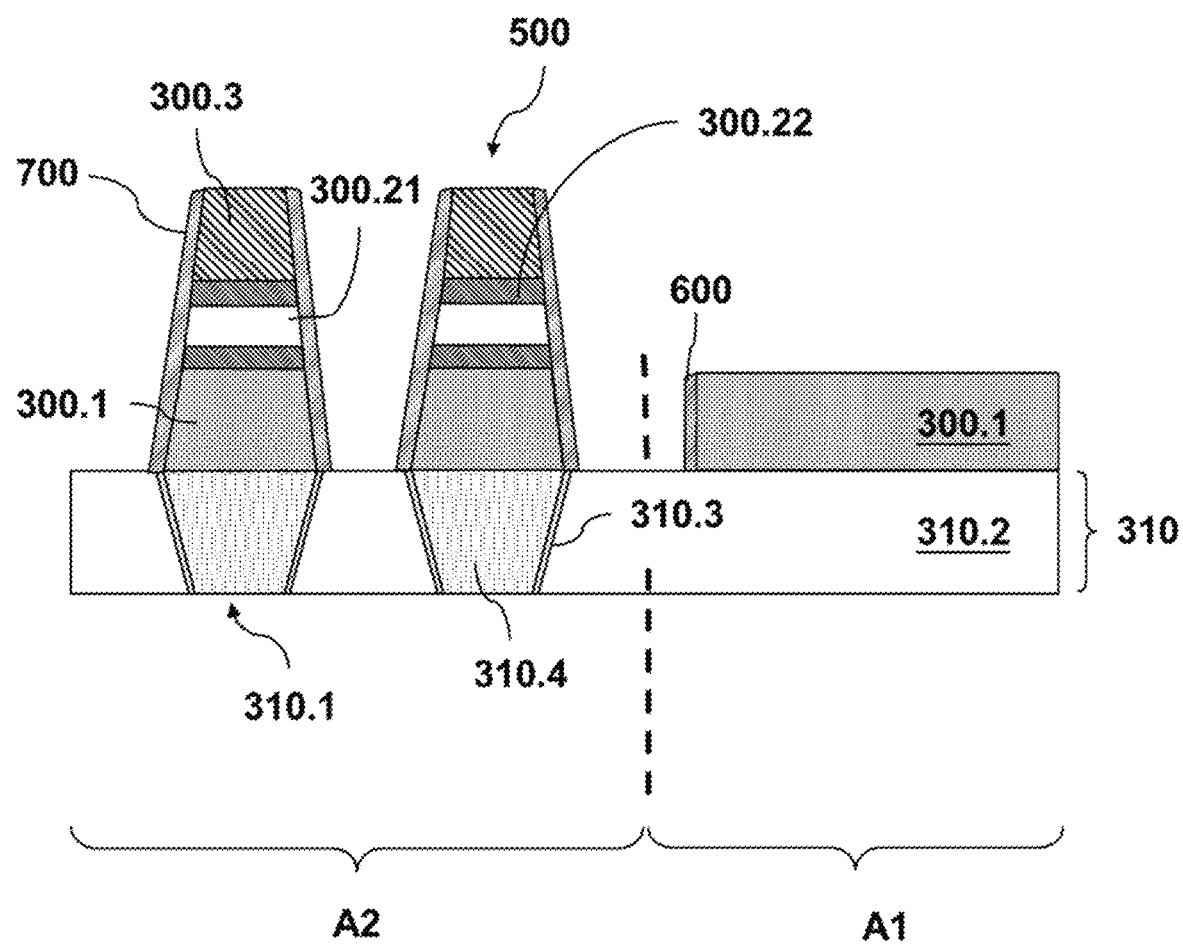
FIG. 7 is a cross-sectional view of exemplary magnetic tunnel junction structures over an interconnect layer after an etchback process of a capping layer, according to some embodiments.

In some embodiments, and referring to FIG. 7, an anisotropic etchback process can be used to remove portions of the capping layer 600 on horizontal surfaces of MTJ structures 500 in second area A2 above interconnect layer 310 (e.g., in an MRAM cell area of the die) to form spacers 700. In some embodiments, spacers 700 are un-etched portions of capping layer 600 that cover the side surfaces of MTJ structures 500. According to some embodiments, capping layer 600 is not removed from bottom electrode 300.1 at the periphery of the die (e.g., in first area A1 above interconnect layer 310). For example, a photoresist pattern over capping layer 600 on the periphery of the die can protect capping layer 600 during the anisotropic etchback process. Therefore, spacers 700 can be selectively formed on side surfaces (or sidewall surfaces) of MTJ structures 500 in the MRAM cell area of a die (e.g., second area A2 above interconnect layer 310). In some embodiments, spacer 700 can provide structural support and protect MTJ structures 500 from plasma damage during subsequent etch operations.

According to some embodiments, the anisotropic etchback process can be either an ion beam etch process, or an RIE process that uses an inductively coupled plasma (ICP) process (RIE-ICP). In some embodiments, the ion beam etch process can use an ion beam produced from a He, Ne, Ar, Kr, or Xe plasma with a beam energy between 100 eV to 1200 eV. Further, the incident beam angle during the etch can be between 0° and about 70°. The RIE-ICP process can use etchants such as tetrafluoromethane ($CF_4$), fluoroform ($CH_2F_2$), $Cl_2$, Ar, He, an organic gas, or combinations thereof. The transformer coupled plasma (TCP) power for the plasma generation can range from about 100 Watts to about 1400 Watts, with a bias applied to the substrate (e.g., through an electrostatic chuck) between 0 to about 300V.

Figure 8:
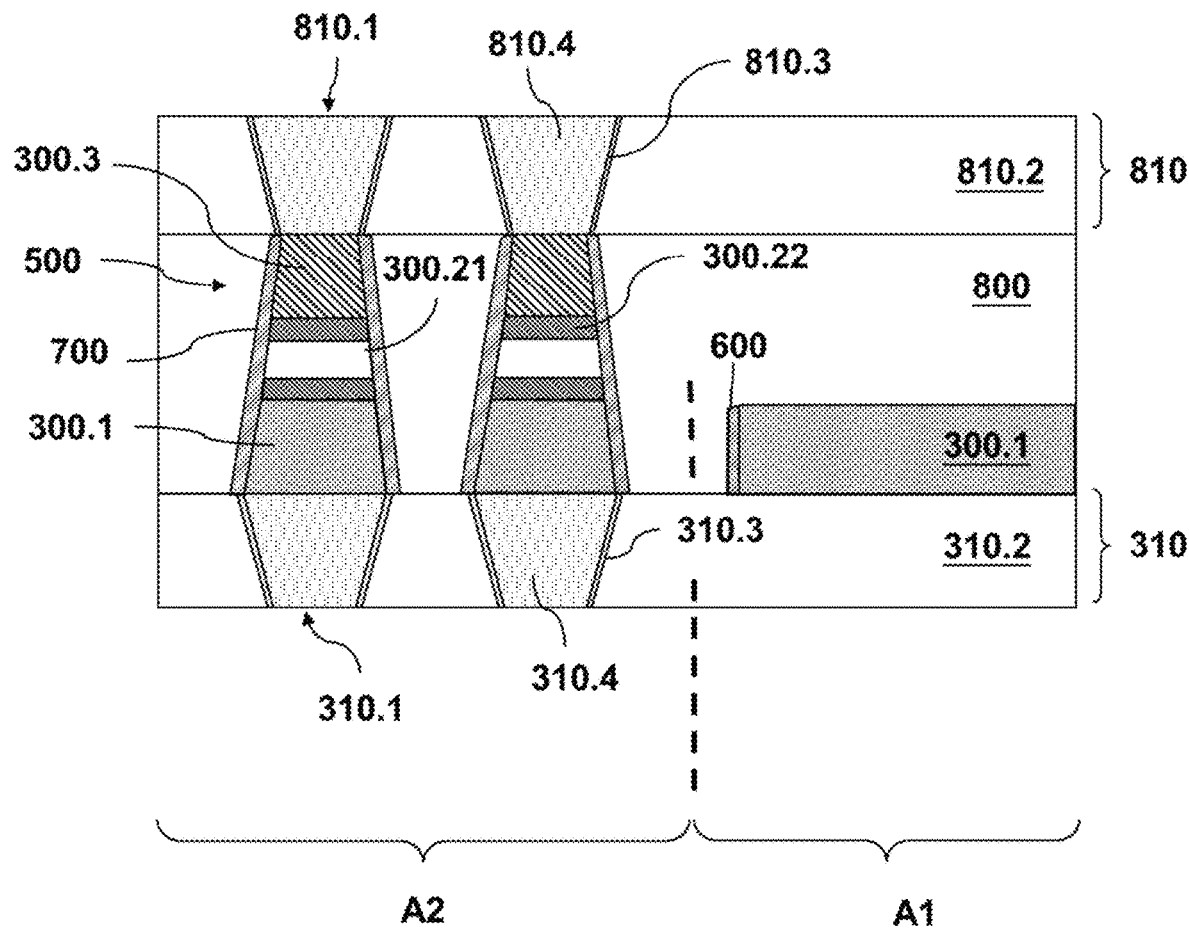
FIG. 8 is a cross-sectional view of exemplary magnetic tunnel junction structures over an interconnect layer after the formation of an interlayer dielectric and a top interconnect layer, according to some embodiments.

In referring to FIG. 8, and according to some embodiments, an ILD 800 can be deposited over interconnect layer 310. In some embodiments, ILD 800 surrounds MTJ structures 500 (e.g., at an MRAM cell area of the die) and bottom electrode 300.1 (e.g., at the periphery of the die). In some embodiments, ILD 800 layer can be a low-k material with a dielectric constant less than 3.9 (e.g., 3.4). In some embodiments, ILD 800 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 800 can be deposited by an HDPCVD or a PECVD process.

In some embodiments, another interconnect layer 810 can be formed on top of ILD 800. Vias 810.1 of interconnect layer 810 can connect to top electrodes 300.3 of MTJ structures 500, according to some embodiments. Interconnect layer 810 can be similar to interconnect layer 310 and can include one or more vias 810.1 and lines (not shown in FIG. 8) embedded in ILD 810.2, according to some embodiments. Vias 810.1 can be filled with a metal stack that can include a barrier layer 810.3 and a metal fill 810.4, according to some embodiments. By way of example and not limitation, barrier layer 810.3 can be a TaN/Ta stack, and metal fill 810.4 can be electroplated copper. In some embodiments, barrier layer 810.3 can be deposited by, for example, a PVD process. ILD 810.2 can be a low-k dielectric with a k-value less than 3.9 (e.g., 3.2). In some embodiments, ILD 810.2 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 810.2 can be deposited by an HDPCVD or a PECVD process.

In some embodiments, interconnect layer 810 may include lines, which are not shown in FIG. 8. In addition, interconnect layer 810 may not be limited to a single interconnect layer and may include one or more interconnect layers formed on top of one another. In some embodiments, interconnect layer 810 may be different from interconnect layer 310 in terms of layout, number and size of vias/lines, materials used for the vias, lines, and interlayer dielectrics. In some embodiments, interconnect layer can be a portion of BEOL interconnects or a portion of far BEOL interconnects.

The present disclosure is directed to an exemplary fabrication method that utilizes an ion beam etch process during the formation of an MTJ structure. The ion beam etch, which uses an inert gas instead of a halogen gas (as used in an RIE etch process), is an anisotropic etch that can etch through an MTJ structure—e.g., top electrode, MTJ layers, and bottom electrode—without contaminating the MTJ structure with ionic mobile charges (e.g., halogen ions, such as chlorine ions). Further, a hard mask layer can be formed at a periphery of a die to mitigate loading effects (e.g., etch rate differences) between high density areas of a die (e.g., MRAM regions) and low density areas of a die (e.g., the periphery of the die) due to the ion beam process. Since the disclosed ion beam etch process is not a source of ionic mobile charges, additional processing operations (e.g., photolithography and etching operations) that would be required to mitigate the ionic mobile charge generation (e.g., during the bottom electrode etch) are no longer necessary. As a result, the MTJ formation process can be simplified in terms of the number of operations required, which in turn reduces the generation of defects through processing and the manufacturing cost.

In some embodiments, a method includes forming, on an interconnect layer, magnetic tunnel junction (MTJ) structure layers including an MTJ stack interposed between a top electrode and a bottom electrode, where the interconnect layer includes a first area and a second area. The method further includes depositing a mask layer over the MTJ structure layers in the first area; forming masking structures over the MTJ structure layers in the second area, where the masking structures are formed over vias in the second area of the interconnect layer. The method also includes etching, with an ion beam etch process, the MTJ structure layers between the masking structures to form MTJ structures over the vias in the second area of the interconnect layer; and removing, with the ion beam etch process, the mask layer, the top electrode, the MTJ stack, and a portion of the bottom electrode in the first area of the interconnect layer In some embodiments, a method includes forming a stack over a substrate with a first area and a second area different from the first area, where the stack comprises magnetic tunneling junction (MTJ) layers interposed between a bottom electrode layer and a top electrode layer. The method also includes forming a mask layer on the stack over the first area of the substrate; forming masking structures on the stack over the second area of the substrate; and removing from the second area, with an ion beam etch process, the stack between the masking structures to form MTJ structures. Further, removing from the first area, with the ion beam etch process, the mask layer, the top electrode layer, the MTJ layers, and a portion of the bottom electrode layer; forming, in the second area, a spacer on each sidewall of the MTJ structures; and forming, in the first area, a spacer layer over a top surface and a sidewall surface of the bottom electrode layer.

In some embodiments, a structure includes an interconnect layer over a substrate, where the interconnect layer includes a first area and a second area. The structure further includes a magnetic tunneling junction (MTJ) structure on the second area of the interconnect layer, where the MTJ structure includes a bottom electrode and is in contact with a respective via of the interconnect layer; a metal layer on the first area of the interconnect layer, where the bottom electrode of the MTJ structure is taller than the metal layer; a spacer on each side surface of the MTJ structure; and a spacer layer on a top surface and a side surface of the metal layer.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, on an interconnect layer, magnetic tunnel junction (MTJ) structure layers comprising an MTJ stack interposed between a top electrode and a bottom electrode, wherein the interconnect layer comprises a first area and a second area;
   depositing a mask layer over the MTJ structure layers in the first area;
   forming masking structures over the MTJ structure layers in the second area, wherein the masking structures are formed over vias disposed in the second area of the interconnect layer;
   etching, with an ion beam etch process, the MTJ structure layers between the masking structures to form MTJ structures over the vias in the second area of the interconnect layer;
   removing, with the ion beam etch process, the mask layer, the top electrode, the MTJ stack, and a portion of the bottom electrode in the first area of the interconnect layer; and
   depositing a spacer layer over MTJ structures in the second area and the bottom electrode in the first area of the interconnect layer.

2. The method of claim 1, wherein the second area comprises a magnetic random access memory (MRAM) cell of a die, and the first area comprises a periphery of the die.

3. The method of claim 1, wherein the ion beam etch process comprises an ion beam with an energy between about 100 eV and about 200 eV.

4. The method of claim 1, wherein the ion beam etch process comprises an ion beam with an incident beam angle between about 0° and about 65° measured from a vertical axis perpendicular to a top surface of the MTJ stack.

5. The method of claim 1, wherein the ion beam etch process comprises an etch temperature between about 40° C. and about 120° C.

6. The method of claim 1, wherein the ion beam etch process uses a gas comprising helium, neon, argon, krypton, or xenon.

7. The method of claim 1, wherein the mask layer comprises tantalum, titanium nitride, ruthenium, oxide, silicon carbide, or silicon nitride, and wherein depositing the mask layer comprises depositing the mask layer by a physical vapor deposition process or a chemical vapor deposition process.

8. The method of claim 1, wherein forming the masking structures comprises:
   depositing a hard mask layer over the MTJ structure layers;
   disposing photoresist over the hard mask layer;
   patterning the photoresist to form photoresist structures over the hard mask layer, wherein the photoresist structures are disposed above the vias in the second area of the interconnect layer; and
   etching, between the photoresist structures, the hard mask layer, and a portion of the top electrode.

9. The method of claim 1, further comprising:
   removing with an ion beam, in the second area, the spacer layer from top surfaces of the MTJ structures to form a spacer on each sidewall of the MTJ structures;
   forming an interlayer dielectric between the MTJ structures in the second area and over the spacer layer in the first area of the interconnect layer, wherein a top surface of the interlayer dielectric is substantially coplanar with the top surfaces of the MTJ structures; and
   forming another interconnect layer over the interlayer dielectric.

10. A method, comprising:
   forming a stack over a substrate with a first area and a second area different from the first area, wherein the stack comprises magnetic tunneling junction (MTJ) layers interposed between a bottom electrode layer and a top electrode layer;
   forming a mask layer on the stack over the first area of the substrate;
   forming masking structures on the stack over the second area of the substrate; and
   removing, with an ion beam etch process, the stack between the masking structures in the second area, to form MTJ structures;
   removing, with the ion beam etch process, the mask layer, the top electrode layer, the MTJ layers, and a portion of the bottom electrode layer in the first area;
   forming, in the second area, a spacer on each sidewall of the MTJ structures; and
   forming, in the first area, a spacer layer over a top surface and a sidewall surface of the bottom electrode layer.

11. The method of claim 10, wherein removing the stack comprises physically connecting the MTJ structures to conductive structures.

12. The method of claim 10, further comprising:
   forming, over the second area of the substrate, an interlayer dielectric between the MTJ structures; and
   forming, over the first area of the substrate, another interlayer dielectric on the spacer layer.

13. The method of claim 10, wherein the ion beam etch process uses a gas comprising helium, neon, argon, krypton, or xenon.

14. The method of claim 10, wherein the second area comprises a magnetic random access memory (MRAM) cell of a die; and the first area comprises a periphery of the die.

15. The method of claim 10, wherein the ion beam etch process comprises:
   an etch temperature between about 40° C. and about 120° C.;
   an ion beam energy between about 100 eV and about 1200 eV; and
   a beam incident angle between about 0° and about 65° measured from a vertical axis perpendicular to a top surface of the stack.

16. The method of claim 10, wherein the mask layer comprises tantalum, titanium nitride, ruthenium, oxide, silicon carbide, or silicon nitride, and wherein forming the mask layer comprises depositing the mask layer by a physical vapor deposition process or a chemical vapor deposition process.

17. A structure, comprising:
   an interconnect layer over a substrate, wherein the interconnect layer comprises a first area and a second area;
   a magnetic tunneling junction (MTJ) structure on the second area of the interconnect layer, wherein the MTJ structure comprises a bottom electrode and is in contact with a respective via of the interconnect layer;
   a metal layer on the first area of the interconnect layer, wherein the bottom electrode of the MTJ structure is taller than the metal layer;
   a spacer on each side surface of the MTJ structure; and
   a spacer layer on a top surface and a side surface of the metal layer.

18. The structure of claim 17, wherein each of the spacer and the spacer layer comprises silicon nitride, silicon oxide, silicon carbide, metal oxide, or combinations thereof.

19. The structure of claim 17, wherein the MTJ structure comprises a top electrode comprising tantalum, titanium nitride, tantalum nitride, tungsten, or combinations thereof.

20. The structure of claim 17, wherein each of the metal layer and the bottom electrode comprises tantalum, tantalum nitride, ruthenium, copper or combinations thereof.

* * * * *